United States Patent [19]

Markow et al.

[11] Patent Number: 5,038,099
[45] Date of Patent: Aug. 6, 1991

[54] RADIAL AIR-CORE GAUGE

[75] Inventors: Paul A. Markow, Huntsville; William Nolle, Hazel Green; Hugo A. Jenrath, Huntsville; John L. Evans, Madison; Alfred H. Glover, Decatur; Joseph T. Betterton, Arab, all of Ala.

[73] Assignee: Acustar, Inc., Troy, Mich.

[21] Appl. No.: 431,130

[22] Filed: Nov. 3, 1989

[51] Int. Cl.⁵ ................................................ G01R 5/16
[52] U.S. Cl. .................................. 324/140 D; 324/143; 324/151 A
[58] Field of Search .............. 324/151 A, 151 R, 143, 324/146, 140 R, 140 D

[56] References Cited

U.S. PATENT DOCUMENTS

| | | | |
|---|---|---|---|
| 2,498,726 | 2/1950 | Towner | 324/146 |
| 2,849,679 | 8/1958 | Barlett | 324/146 |
| 4,492,920 | 1/1985 | Reenstra | 324/146 |
| 4,760,333 | 7/1988 | Ichimura | 324/143 |
| 4,924,178 | 5/1990 | Miyagima | 324/143 |
| 4,928,060 | 5/1990 | Ito | 324/143 |

FOREIGN PATENT DOCUMENTS 0252260 10/1988 Japan ...................... 324/146

Primary Examiner—Kenneth A. Wieder
Assistant Examiner—Jose M. Solis
Attorney, Agent, or Firm—Wendell K. Fredericks

[57] ABSTRACT

A radial type air-core gauge includes orthogonally positioned pairs of stator coils wound on independent coil forms spaced radially 90 degrees apart about a central cup of a gauge case. The cup houses a permanent magnet rotor which rotates about a shaft extending from a support bearing in a bottom surface of the cup to a hub of a dial pointer. Movement of the shaft causes a dial pointer to move over a dial face in response to changes of a balanced resultant field caused by variations of excitation signals applied to the stator coils.

7 Claims, 2 Drawing Sheets

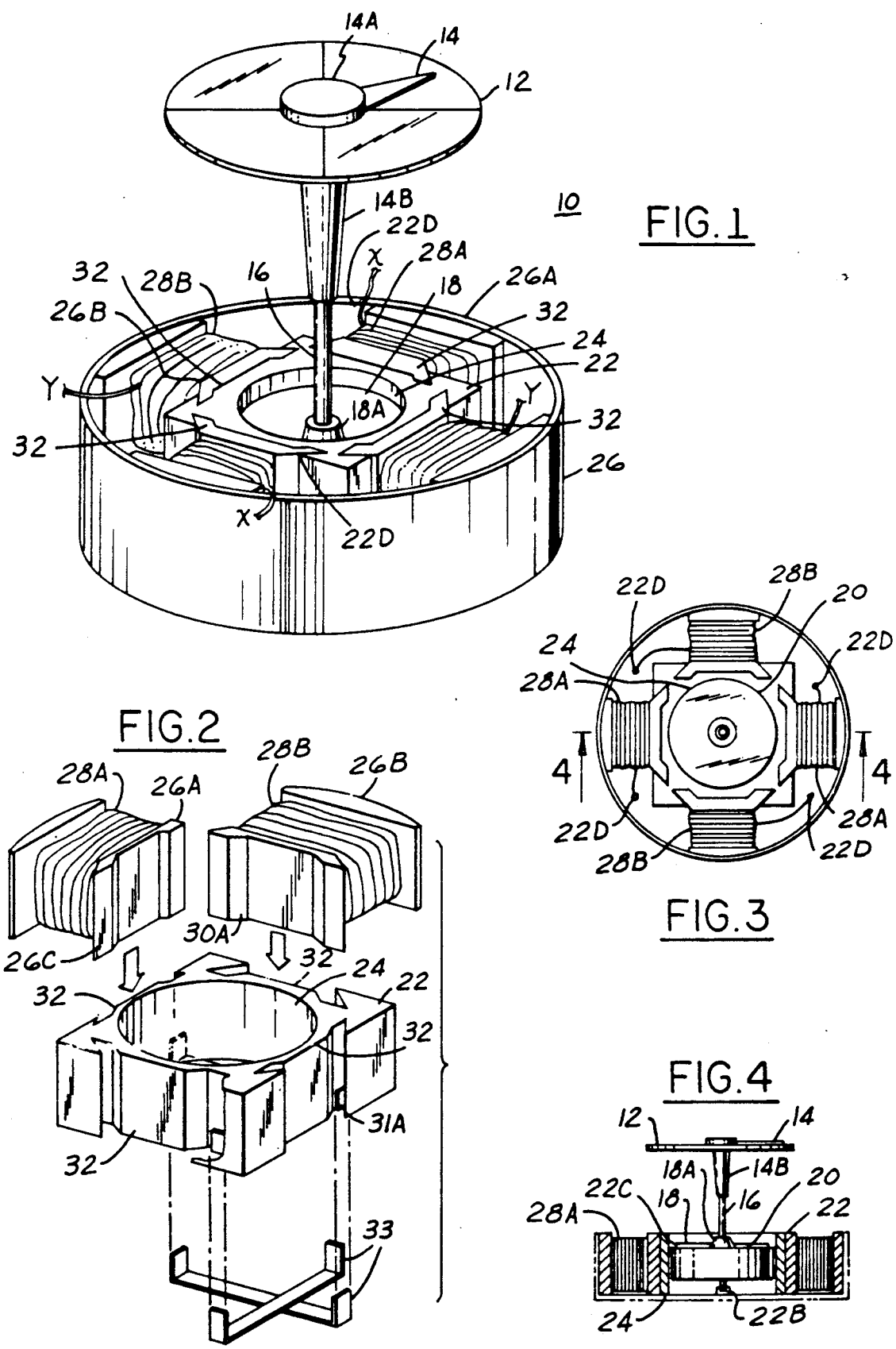

RADIAL AIR-CORE GAUGE

BACKGROUND OF THE INVENTION

1. Field of the Invention

The present invention relates generally to novel air core gauges employing magnetic field techniques and particularly to air-core gauges and magnetic field techniques therefor which control orienting radially magnetized rotors over an infinite number of angular displacements.

2. Description of the Prior Art

A problem exists in the prior art in forming low profile air-core gauges. Most air-core gauges employ cross-coil arrangements whereby one cross-coil affects interaction with the magnetic rotor differently than the other cross-coil since the magnetic proximity to the rotor of the two coils differ. Reissued U.S. Pat. No. 32,604 dated Feb. 16, 1988 of A. L. Reenstra describes such a coil arrangement. Such a coil arrangement appears to not address the issue of providing a low profile gauge.

A U.S. Pat. No. 4,922,726 dated Feb. 12, 1991 entitled "Woven Crossed-Coil Air-Core Gauge" of Markow, et al. teaches a compact air-core gauge having interlaced stator windings. Such an arrangement yields interchangeable cross-coils which equally effect interaction with the magnetic rotor. Such an arrangement virtually eliminates any positional errors due to unbalanced stato winding fields and it also provides a low profile gauge.

In stepper motor art, 90 degree permanent magnet (PM) step motors have radially magnetized rotors which rotate into alignment with the energized stator winding(s). Such devices appear suitable for accurately positioning and holding loads in the stepped position without the use of encoders or other feedback devices. It makes discrete angular steps rather than an infinite variety of angular displacements as in air-core gauges. Magnetic fields in step motors change quickly when starting, stopping and reversing direction of the rotor. Step motors provide a wide range of rotating speeds directly proportional to the frequency of the input pulse signals rather than to changes in phase and magnitude of complementary analog signals. Step motors align rotors with magnetic poles while air-core gauges align rotors with magnetic fields.

Since most step motors require high torque, rotor pole strength (+m and −m) separated by a distance (L) and the field intensity (H) of the stator coil windings must be high relative to the rotor pole strength and stator field intensity of the air-core gauge. The magnetic moment of a magnet (M) equals m*L. The torque acting on a magnet of magnetic moment M units in a field of intensity of H oersteds is (mHL*sin K), where K equals the angle which the magnet rotor makes with the line of force of the field H. Magnetic moment and field intensity in air-core gauges would be drastically different from those of step motors since ferrite material is not used to concentrate magnetic fields in the coils.

The step motor uses, in most cases, a ferrite stator winding core form to generate high H's while the air-core gauge uses non-metallic core forms. The ferrite cores used in stepper motors to increase flux density tend to distort the fields when used in air-core gauges. This field distortion causes inaccurate pointer deflection angles. Therefore, air-core gauge geometry must be optimized to provide maximum field strength without ferrite cores.

BRIEF SUMMARY OF THE INVENTION

The present invention concerns rotor aligning in a novel 90 degree radial type air-core gauge. Individual stator coils on individual coil forms insert in substantially precisely axially aligned slots about a nonmetallic thin wall cup housing a radially magnetized rotor. Each stator coil, wound for interchangeability, contains equal numbers of turns of the same size and resistance wire and wound so that any two poles located opposite each other will have the same polarity (N and N or S and S). A pair of these serially connected coils, disposed at right angles, generate independent magnetic flux fields which, when summed, form balanced resultant magnetic fields (that is, symmetrically about a common vector axis). Changes in phase and direction of analog current signals rather than changes in frequency of the excitation signal as in step motors through these coils will cause the resultant magnetic field to rotate about a central axis of the rotor causing the rotor to move through an infinite number of angular displacements. Winding the coils on individual coil forms permit use of conventional low cost core winding equipment and highly efficient control of flux density values of each coil.

BRIEF DESCRIPTION OF THE DRAWINGS

FIG. 1 illustrates a perspective view of a radial type air-core gauge embodying the principles of the present invention;

FIG. 2 depicts in view A an individual core form with a coil wound upon it and in view B a central case with pockets for holding the individual coil forms and the coils wound thereon;

FIG. 3 illustrates a top view of the gauge of the present invention showing the locations of the coils and rotor;

FIG. 4 illustrates a side view of the gauge of FIG. 1.;

DETAILED DESCRIPTION OF A PREFERRED EMBODIMENT

Figure 5:
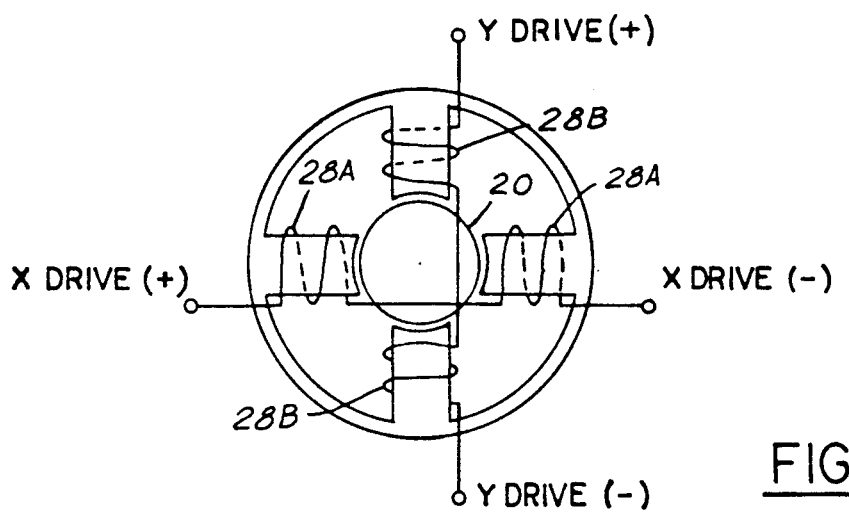
FIG. 5 illustrates the serially connected X and Y coils.

Referring now to FIG. 1, a perspective view depicts the radial air-core gauge 10 of the present invention. A pointer 14 moves over a dial face 12 in response to changes in orientation of a bi-polar magnetic rotor 20 (best seen in FIG. 4) having + and − poles equally spaced about a centroid. The pointer 14 of FIG. 1 has a hub 14A and a hub sleeve 14B which fixedly attaches to a top end of a non-metallic rotor shaft 16. The rotor 20 attaches near a bottom end of the shaft and rotates in a thin wall cup 24 within a plastic material gauge case 22, the bottom end of the shaft rotating in a support bearing 22B (best seen in FIG. 4) centrally located at the bottom of the gauge case 22.

The gauge case 22 includes four pockets 32, each pocket 32 disposed 90° apart for holding an end of a coil form 26A and a coil 28A wound thereon juxtaposed to the cup 24. Two coils 28A disposed 180° apart about the cup 24 in the X-direction connect electrically in series as does two coils 28B disposed 180° apart about the cup in the Y direction.

A rotor cover 18 with a sleeve bearing 18A attached at one end slidably mounts on shaft 16 over a permanent magnet bipolar rotor 20 and seats about an edge 22C of case 22.

A protective metallic cover 35 surrounds the gauge structure for providing protection against magnetic interference and to provide a flux return path of the flux generated by the stator coils.

FIG. 2 depicts a coil form 26A with a coil 28A wound thereon. The form has a face 26C with an electrical connection terminal 30A. Face 26C inserts in the pocket 32 of case 22 positioning a pole end of the coil radially with respect to the cup perimeter and the rotor therein and forming an electrical connection with a mating electrical terminal 31A within the pocket.

To ensure the generation of balanced magnetic field, each coil form 26A or 26B receives the same number of turns of the same size wire from a conventional coil winder to form interchangeable coils 28A and 28B.

A pair of right angled printed circuit wire runs 33-33, connecting opposite terminals 31A in the pocket 32 of casing 22, interconnect opposite coils in series. A terminating end of each coil connects to an output post 22D located in a region of the casing between the coils.

From a top view, FIG. 3 shows the two orthogonally positioned serial pairs of coils 28A and 28B arranged about cup 24 with a front end of each coil inserted in a pocket 32. The thin walls of cup 32 bring the rotor 22 in close magnetic proximitY to each radially directed coil.

From a side view taken along line 4—4 of FIG. 3, FIG. 4 depicts gauge 10 showing the relationship of the dial 12, pointer 14, the pointer sleeve 14B, the shaft 16, the rotor cover 18, the sleeve bearing 18A, the rotor 20, the cup 24 within case 22 and the coils 28A.

FIG. 5 shows the serially connected orthogonally positioned coils 28A and 28B and the end terminations.

In operation, analog current signals, developed by sources of coil excitation in response to variations of an input measurand signal, apply to the input terminals of both coils simultaneously from conventional drive circuits (not shown). These signals, usually the complement of the other, e.g., a sinusoidal signal applied to the Y coil terminals and a cosinusoidal signal off-set in phase by 90° applied to the X coil terminals generate magnetic flux fields of complementary intensities. When these individual fields mesh, the resultant magnetic field moves in response to the input signal to a resultant angle as expressed in equation 1.

$$\text{Angle of Resultant Magnetic Field} = \text{ARCTAN} \frac{(Y - \text{Magnetic Field Strength})}{X - \text{Magnetic Field Strength})} \quad (1)$$

The magnetic field of the permanent magnet rotor rotates into alignment with the resultant field to provide an indication of the magnitude of the measurance represented by the input signals.

Figure 6:
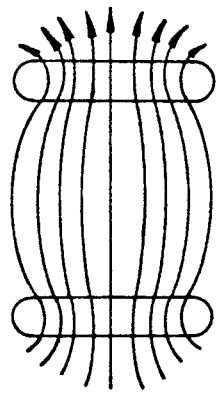
FIGS. 6, 7 and 8 depict the magnetic fields of the Y, X and the sum or resultant field of the X and Y fields.
Figure 7:
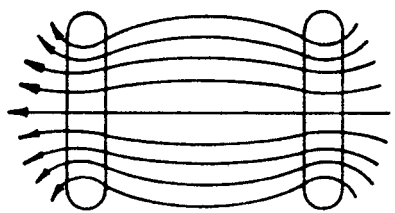
Figure 8:
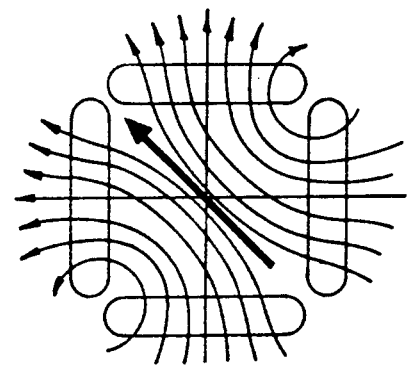

FIG. 6 depicts a flux field resulting from a 45 degree sinusoidal excitation signal applied to the input of the X coil; FIG. 7 depicts a 45 degree complementary cosinsoidal excitation signal applied to the input of the Y coil; and FIG. 8 depicts the resultant field upon which the magnetic field of the rotor 20 aligns. Positioning of the resultant fields and the tracking rotor to an infinite number of angular positions results by varying the magnitudes of the sinusoidal and cosinusoidal excitation signals.

Each coil of the present invention, illustratively, has 1800 turns of number 40 gauge, 218 ohms wire. With current amplitudes of about 0.057 amperes, each coil generates about 99.89 lines of flux per square centimeters. These stator coils present balanced magnetic flux fields which opposes lagging or leading of the dial pointer from the expected or desired magnitude of the sensed measurand.

A rotor-to-stator air gap of about 0.9 mm, with the length of each coil at about 1.29 cm yields a low profile gauge of a height of about 1 cm.

This disclosure shows and describes only a preferred embodiment of the invention. It is to be understood that the invention is capable of use in various other combinations and environments and is capable of changes or modification within the scope to the inventive concept as expressed herein.

We claim:

1. A radial air-core gauge for generating a movable magnetic flux field in a direction and of a field strength proportional to a magnitude and a direction of input electrical signals representing changes in magnitude of a measurand, said gauge having a non-magnetic cover structure, a bipolar-permanent magnet rotor, radially magnetized to have a north and a south pole region spaced equally from a centroid, said rotor being disposed in a central cup of a case structure with a rotatable non-metallic shaft connected from the centroid to a hub pivotal end of a dial pointer of a dial face, said dial face being spaced apart from said case, the rotor movements and dial pointer movements being affected by a permanent magnetic field of the magnetized rotor aligning with orientations of the movable magnetic flux fields, said gauge further comprising:

a first pair of spaced apart, radially disposed and axially aligned stator coils and a second pair of spaced apart, radially disposed and axially aligned stator coils, each coil of said first and second pair of coils being wound on a non-metallic bobbin structure perpendicular with each individual coil of said first and second pair of coils being radially mounted about the central cup in magnetic field coupling with the centrally disposed magnet rotor, each individual coil being wound to be physically interchangeable, each aligned pair of coils being connected electrically in series and separated orthogonally from the other so as to generate a common directed magnetic flux field, said first and second pair of coils being responsive to analog electrical excitations for generating complementary magnetic flux fields to orientate a resultant field in an infinite number of vectorial directions within the cup of the casing for interacting with a magnetic field of the rotor causing the rotor to come into alignment with the field orientations which, in turn, cause said pointer to move about said dial face to graduations on the dial face that are directly proportional to the changes in magnitude of the measurand.

2. Gauge of claim 1 wherein each coil of said first and second pairs of stator coils are wound on an individual coil form and has substantially the same coil resistance, length, radius, wire size and number of turns.

3. Gauge of claim 2 wherein said case structure includes form pockets each pocket disposed 90 degree apart for holding an end of the coil form juxtaposed to the cup.

4. Gauge of claim 3 wherein said cup of said case structure has a wall surface of about 0.9 mm thick for forming a comparable rotor-to-stator coil spacing.

5. Gauge of claim 4 wherein both the length and width of said gauge, excluding said dial face and said pointer, is substantially small with respect to a length of each coil of said first or second pair of stator coils whereby the substantially small length and width causes the achievement of a low profile gauge is achieved.

6. Gauge of claim 5 wherein said first and said second pair of stator coils respond to generate substantially equal flux intensity from substantially equal analog electrical current excitation, said pairs of coils also responding to generate complementary fields in response to complementary sinusoidal and cosinusoidal signals.

7. Gauge of claim 5 including a metallic cover for providing protection against magnetic interference and to provide a flux return path of the flux generated by said pairs of coils.

* * * * *